(12) United States Patent
Cheng et al.

(10) Patent No.: US 8,575,670 B2
(45) Date of Patent: Nov. 5, 2013

(54) EMBEDDED DYNAMIC RANDOM ACCESS MEMORY DEVICE FORMED IN AN EXTREMELY THIN SEMICONDUCTOR ON INSULATOR (ETSOI) SUBSTRATE

(75) Inventors: Kangguo Cheng, Guilderland, NY (US); Joseph Ervin, Wappingers Falls, NY (US); Chengwen Pei, Danbury, CT (US); Ravi M. Todi, Poughkeepsie, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 13/316,056

(22) Filed: Dec. 9, 2011

(65) Prior Publication Data

US 2013/0146957 A1   Jun. 13, 2013

(51) Int. Cl.
*H01L 27/108* (2006.01)

(52) U.S. Cl.
USPC .......... 257/301; 438/243; 257/E27.092; 257/E21.653

(58) Field of Classification Search
USPC .......... 438/243; 257/301, E27.092, E21.653
See application file for complete search history.

(56) References Cited

U.S. PATENT DOCUMENTS

| | | | |
|---|---|---|---|
| 6,693,016 B2 | 2/2004 | Gutsche et al. | |
| 7,671,394 B2 | 3/2010 | Booth, Jr. et al. | |
| 7,682,896 B2 | 3/2010 | Ho et al. | |
| 7,741,188 B2 | 6/2010 | Dyer et al. | |
| 7,939,876 B2 | 5/2011 | Cheng et al. | |
| 7,999,298 B2 | 8/2011 | Kavalieros et al. | |
| 2003/0207531 A1 | 11/2003 | Lin | |
| 2009/0230471 A1* | 9/2009 | Li et al. | 257/347 |
| 2009/0289291 A1* | 11/2009 | Cheng et al. | 257/301 |
| 2010/0144106 A1* | 6/2010 | Cho et al. | 438/243 |
| 2010/0213522 A1* | 8/2010 | Cheng et al. | 257/301 |
| 2011/0272762 A1* | 11/2011 | Booth et al. | 257/347 |

* cited by examiner

*Primary Examiner* — Trung Q Dang
(74) *Attorney, Agent, or Firm* — Scully, Scott, Murphy & Presser, P.C.; Joseph P. Abate, Esq.

(57) ABSTRACT

A memory device including an SOI substrate with a buried dielectric layer having a thickness of less than 30 nm, and a trench extending through an SOI layer and the buried dielectric layer into the base semiconductor layer of the SOI substrate. A capacitor is present in a lower portion of the trench. A dielectric spacer is present on the sidewalls of an upper portion of the trench. The dielectric spacer is present on the portions of the trench where the sidewalls are provided by the SOI layer and the buried dielectric layer. A conductive material fill is present in the upper portion of the trench. A semiconductor device is present on the SOI layer that is adjacent to the trench. The semiconductor device is in electrical communication with the capacitor through the conductive material fill.

19 Claims, 3 Drawing Sheets

EMBEDDED DYNAMIC RANDOM ACCESS MEMORY DEVICE FORMED IN AN EXTREMELY THIN SEMICONDUCTOR ON INSULATOR (ETSOI) SUBSTRATE

BACKGROUND

The present disclosure generally relates to trench structures, such as trench capacitors. More particularly, the present disclosure relates to memory devices including trench capacitors.

Embedded (dynamic random access memory (DRAM) devices may include trench capacitors. A trench capacitor is a three dimensional device that can be formed by etching a trench into a semiconductor substrate. After trench etching, a buried plate electrode, also referred to as a diffusion plate, is typically formed about the exterior portion of the trench and a node dielectric is then formed on the inner walls of the trench. Next, the trench can be filled, for example, with doped polysilicon, such as N-type polycrystalline silicon ("N-type Poly-Si"). The doped poly-Si serves as one electrode of the capacitor, often referred to as the upper electrode or storage node, and the buried plate electrode serves as a second electrode of the capacitor, often referred to as the lower electrode. The node dielectric separates the buried plate and the upper electrode, and serves as the insulating layer of the trench capacitor.

SUMMARY

A method of forming a memory device is provided, in which the capacitor of the memory device is formed in a trench that extends through a buried dielectric layer of an extremely thin semiconductor on insulator (ETSOI) substrate, in which the buried dielectric layer has a thickness of less than 30 nm. In one embodiment, the method may include providing a semiconductor on insulator (SOI) substrate including a semiconductor on insulator (SOI) layer over a buried dielectric layer, wherein the buried dielectric layer has a thickness of less than 30 nm. The buried dielectric layer is present on a base semiconductor layer. A trench may be formed through the SOI layer and the buried dielectric layer and extensions into the base semiconductor layer, and a capacitor may be formed in the trench. The capacitor may then be recessed into the trench to a depth that is below the buried dielectric layer. A dielectric spacer is formed on the sidewalls of the trench. The dielectric spacer is present on the sidewall portions of the trench that are provided by the SOI layer and the buried dielectric layer. The trench is then filled with a connecting conductive material that is present on the capacitor. A semiconductor device may then be formed on the SOI layer. The semiconductor device is present in electrical communication with the capacitor through the connecting conductive material.

In another aspect, a memory device is provided that includes a semiconductor on insulator (SOI) substrate including a semiconductor on insulator (SOI) layer over a buried dielectric layer having a thickness of less than 100 nm. The buried dielectric layer is present on a base semiconductor layer. A trench extends through the SOI layer and the buried dielectric layer into the base semiconductor layer of the SOI substrate. A capacitor is present in a lower portion of the trench. A dielectric spacer is present on the sidewalls of the upper portion of the trench. The dielectric spacer is present on the sidewall portions of the trench that are provided by the SOI layer and the buried dielectric layer. A conductive material fill is present in the upper portion of the trench. A semiconductor device is present on a portion of the SOI layer that is adjacent to the trench. The semiconductor device is in electrical communication with the capacitor through the conductive material fill.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Detailed embodiments of the present disclosure are disclosed herein; however, it is to be understood that the disclosed embodiments are merely illustrative and may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The embodiments of the present disclosure relate to memory devices formed on extremely thin semiconductor on insulator (ETSOI) substrates, in which the memory devices include trench capacitors. As used herein, the term "memory device" means a structure in which the electrical state thereof can be altered and then retained in the altered state, in this way a bit of information can be stored. An "ETSOI substrate" is a semiconductor on insulator (SOI) substrate, in which the semiconductor on insulator (SOI) layer has a thickness of 10 nm or less. It has been determined that for memory devices including trench capacitors, such as embedded dynamic random access memory (eDRAM) devices, that are formed in ETSOI substrates, the total thickness of the SOI layer and the underlying buried dielectric layer may be insufficient for effectively controlling the etching steps required for recessing the capacitor elements within the trench. Additionally, the high-k dielectrics and metal elements of the trench capacitor may be exposed to complementary metal oxide semiconductor (CMOS) processing after the formation of the trench capacitor. The high-k dielectrics and the metal elements of the trench capacitor that are exposed to CMOS processing may be the source of contamination that degrades device performance and reduces manufacturing yield.

The methods and structures disclosed herein overcome the above noted disadvantages by recessing the capacitor in the trench, removing the "contaminated portions" of the trench structure, and forming a dielectric spacer on the sidewalls of the trench provided by the buried dielectric layer and the SOI layer of the ETSOI substrate. The contaminated portions of the trench include the metal layer that provides the upper electrode, the node dielectric layer, and the semiconductor fill material that is present in the upper portion of the trench. The dielectric spacer may also be present over and sealing the metal electrode of the trench capacitor. The dielectric spacer may also prevent electrical shorts between the electrodes that are present in the trench and the semiconductor layers of the ETSOI substrate. The details of the methods and structures disclosed herein, are now described with better detail with reference to FIGS. 1-5B.

Figure 1:
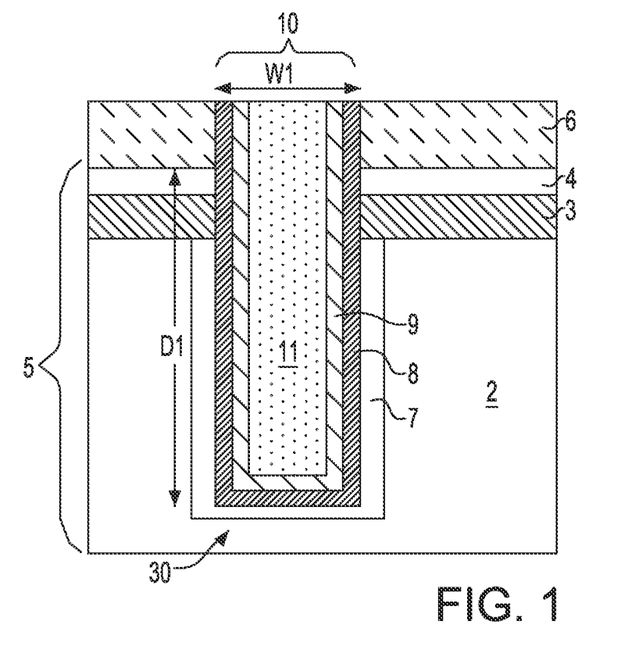
FIG. 1 is a side cross-sectional view depicting forming a trench capacitor in a semiconductor on insulator (SOI) substrate, in accordance with one embodiment of the present disclosure.

FIG. 1 depicts an initial structure for producing a memory structure, in accordance with the methods and structures disclosed herein. In some embodiments, forming the initial structure may include providing an extremely thin semiconductor on insulator (ETSOI) substrate 5, forming a trench 10 through an SOI layer 4 and a buried dielectric layer 3 into a base semiconductor layer 2 of the ETSOI substrate 5, and forming a capacitor 30 in the trench 10.

The extremely thin semiconductor on insulator (ETSOI) substrate 5 includes a semiconductor on insulator (SOI) layer 4 over a buried dielectric layer 3 having a thickness T1 of less than 100 nm, wherein the buried dielectric layer 3 is present on a base semiconductor layer 2. The SOI layer 4 may comprise any semiconducting material including, but not limited to silicon (Si), strained Si, SiC, SiGe, SiGeC, Si alloys, Ge, Ge alloys, GaAs, InAs, and InP, or any combination thereof. The SOI layer 4 may be thinned to a desired thickness for the ETSOI substrate 5 by planarization, grinding, wet etch, dry etch, oxidation followed by oxide etch, or any combination thereof. One method of thinning the SOI layer 4 is to oxidize the silicon (Si) by a thermal dry or wet oxidation process, and then wet etch the oxide layer using a hydrofluoric acid mixture. This process can be repeated to achieve the desired thickness. In one embodiment, the SOI layer 4 of the ETSOI substrate 5 has a thickness ranging from 1.0 nm to 10.0 nm. In another embodiment, the SOI layer 4 has a thickness ranging from 1.0 nm to 5.0 nm. In a further embodiment, the SOI layer 4 has a thickness ranging from 3.0 nm to 8.0 nm. The base semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors. The buried dielectric layer 3 may be composed of any dielectric material. For example, the buried dielectric layer 3 may be composed of an oxide, e.g., silicon oxide, a nitride, e.g., silicon nitride, silicon oxynitride or a combination thereof. The buried dielectric layer 3 may have a thickness of 100 nm or less. In another embodiment, the buried dielectric layer 3 may have a thickness ranging from 5 nm to 50 nm. In yet another embodiment, the buried dielectric layer 3 may have a thickness ranging from 10 nm to 30 nm. In one example, the buried dielectric layer 3 has a thickness of less than 30 nm.

The buried dielectric layer 3 that may be present underlying the SOI layer 4 and atop the base semiconductor layer 2 may be formed by implanting a high-energy dopant into the ETSOI substrate 5 and then annealing the structure to form a buried insulating layer, i.e., dielectric layer 3. In another embodiment, the dielectric layer 3 may be deposited or grown prior to the formation of the SOI layer 4. In yet another embodiment, the ETSOI substrate 5 may be formed using wafer-bonding techniques, where a bonded wafer pair is formed utilizing glue, adhesive polymer, or direct bonding.

In some embodiments, a pad dielectric layer 6 may be present atop the SOI layer 4 of the ETSOI substrate 5. The pad dielectric layer 6 may be a single dielectric layer or may be a multi-layered structure. The pad dielectric layer 6 may be formed on the surface of the ETSOI substrate 5 using deposition and/or thermal growth processes. In one embodiment, the pad dielectric layer 6 may be an oxide, nitride or oxynitride material. In another embodiment, the pad dielectric layer 6 may be composed of silicon oxide or silicon nitride.

In some embodiments, to form the trench 10, an opening is etched through the pad dielectric layer 6 into the ETSOI substrate 5. The pad dielectric layer 6 can be patterned using lithography and etching. In one example, a photolithographic mask (not shown) is produced, by applying a photoresist layer (not shown) on the surface to be etched utilizing a deposition process. The photoresist layer is then patterned utilizing lithography so as to expose selective regions of the pad dielectric layer 6 in which trenches 10 are to be formed. The pattern is then transferred into the pad dielectric layer 6 using an etching process, such as reactive-ion etching (RIE), ion beam etching, or plasma etching. The opening through the pad dielectric layer 6 may have a width W1 that ranges from 30 nm to 250 nm. In another embodiment, the opening through the pad dielectric layer 6 may have a width W1 that ranges from 50 nm to 200 nm. In some embodiments, the width W1 of the opening through the pad dielectric layer 6 dictates the width of the trench 10.

Thereafter, the exposed portion of the ETSOI substrate 5 is etched to provide the trench 10 having a depth D1 terminating in the base semiconductor layer 2. The trench 10 may be formed using an anisotropic etch process. As used herein, an "anisotropic etch process" denotes a material removal process in which the etch rate in the direction normal to the surface to be etched is higher than in the direction parallel to the surface to be etched. Dry anisotropic etching processes suitable for forming the trench 10 include, but are not limited to, reactive ion etch, ion-beam etching, plasma etching or a combination thereof. Reactive ion etching (RIE) is a form of plasma etching in which during etching the surface to be etched is exposed to reactive gases in the presence of an RF field. The etch process for forming the trench 10 removes the material of the ETSOI substrate 5 selectively to the pad dielectric stack 6. As used herein, the term "selective" in reference to a material removal process denotes that the rate of material removal for a first material is greater than the rate of removal for at least another material of the structure to which the material removal process is being applied. In some examples, the selectivity may be greater than 10:1. In other embodiments, the selectivity may be greater than 100:1. In one embodiment, the final depth $D_1$ of the trench 10, as measured from the top surface of the SOI layer 4 is as great as 10 μm. In one example, the final depth $D1_1$ is on the order of about 3 μm to 4 μm. The aspect ratio (height to width ratio) of the trench 10 may range from 20:1 to 100:1. In one example, the aspect ratio of the trench 10 is 30:1. The patterned photoresist layer can be removed after at least transferring the pattern into the pad dielectric layer 6 utilizing techniques such as, for example, ashing.

FIG. 1 further depicts forming a capacitor 30 (also referred to as trench capacitor) in the trench 10. Typically, the capacitor includes two electrodes 7, 9 separated by a dielectric layer 8 (hereafter referred to as "node dielectric layer 8"). The first electrode 7 (also referred to as "lower electrode") may be formed in the sidewalls and/or base of the trench 10 or may be deposited on the sidewalls and/or base of the trench 10. The entire base semiconductor layer 2 may be doped and serves as the first electrode. The term "about" as used to describe the location of the first electrode 7, i.e., being "about" the sidewall and the base of the trench 10, describes both embodiments in which the first electrode 7 is formed on, or is formed within, the base and sidewalls of the trench 10. In the embodiments, in which the first electrode 7 is formed in the sidewalls and base of the trench 10, as illustrated in FIG. 1, the portion of the trench 10 that is present in the base semiconductor layer 2 may be doped with an n-type or p-type dopant. In one embodiment, the n-type or p-type dopant that is implanted into the sidewalls and base of the base semiconductor layer 2 may be present in a concentration ranging from $1 \times 10^{14}$ atoms/cm$^3$ to $1 \times 10^{21}$ atoms/cm$^3$. In one example, the dopant source to produce a N+ buried plate diffusion region may be introduced by ion-implantation or gas phase doping. In another example, arsenic doped glass is deposited, e.g., deposited by spin on deposition, on the sidewalls and base of the trench 10, and the n-type or p-type dopant is then diffused from the arsenic doped glass into the sidewalls and base of the trench 10 by thermal annealing.

In the embodiments in which the first electrode (not depicted) is deposited on the sidewalls and base of the trench 10, the first electrode may be composed of a metal selected from the group consisting of tungsten (W), titanium (Ti), tantalum (Ta), platinum (Pt), palladium (Pd), hafnium (Hf), zirconium (Zr), aluminum (Al) and combinations thereof. The first electrode deposited on the sidewalls and base of the trench 10 may also be composed of a metal nitride selected from the group consisting of titanium nitride (TiN), tantalum nitride (TaN), tantalum silicon nitride (TaSiN), or a combination thereof. The deposited metal that provides the first electrode may be a conformally deposited layer. As used herein, the terms "conformally deposited" and "conformal layer" denote a deposited material having a thickness that remains the same regardless of the geometry of underlying features on which the layer is deposited, wherein the thickness of the layer does not deviate from greater than or less than 20% of an average value for the thickness of the layer. A first electrode composed of a metal or metal nitride may be deposited within the trench 10 using physical vapor deposition (PVD), such as sputtering, atomic layer deposition (ALD) and/or chemical vapor deposition (CVD). The deposited first electrode may be a conformal layer having a thickness ranging from 1 nm to 20 nm, typically being 3 nm to 7 nm. The first electrode may be blanket deposited in the trench 10, and before being recessed in subsequent processing, may be present on the entirety of the base and sidewall surfaces of the trench 10.

FIG. 1 further depicts forming a dielectric layer 8 (hereafter referred to as "node dielectric layer 8") on at least the sidewalls and the base of the trench 10. The node dielectric layer 8 may be composed of any dielectric material, such as oxides, nitrides, and oxynitrides. One example of an oxide that is suitable for the node dielectric layer 8 is silicon oxide (SiO$_2$). One example of a nitride that is suitable for the node dielectric layer 8 is silicon nitride. In some embodiments, the node dielectric layer 8 is composed of a high-k dielectric material. The term "high-k" means that the dielectric constant of the node dielectric layer 8 at room temperature, e.g., 20° C. to 25° C., and at atmospheric pressure, e.g., 1 atm, is greater than the dielectric constant of silicon oxide (SiO$_2$). For example, the dielectric constant of a high-k dielectric material may be greater than 4.0. In another embodiment, the dielectric constant of the high-k dielectric material may range from 7 to 200. In one example, a node dielectric layer 8 composed of a high-k material is a hafnium-containing dielectric, such as hafnium oxide (HfO$_2$). Other dielectric compositions that are suitable for providing a node dielectric layer 8 of a high-k dielectric material may include hafnium silicon oxide, hafnium silicon oxynitride, aluminum oxide, silicon nitride and combinations thereof.

The node dielectric layer 8 may be conformally deposited on the sidewalls and base of the trench 10. In one embodiment, the node dielectric layer 8 may be deposited using chemical vapor deposition (CVD). Variations of CVD processes suitable for providing the dielectric layer 15 include, but are not limited to: Atmospheric Pressure CVD (APCVD), Low Pressure CVD (LPCVD), Plasma Enhanced CVD (EPCVD), Metal-Organic CVD (MOCVD), atomic layer deposition (ALD), and combinations thereof. In another example, the node dielectric layer 8 is deposited using atomic layer deposition (ALD). In one embodiment, the node dielectric layer 8 may have a thickness ranging from 2 nm to 10 nm. In another embodiment, the node dielectric layer 8 may have a thickness ranging from 3 nm to 5 nm. The node dielectric layer 8 may be blanket deposited in the trench 10, and before being recessed in subsequent processing, may be present on the entirety of the base and sidewall surfaces of the trench 10.

FIG. 1 further depicts forming a second electrode 9 (also referred to as upper electrode) of a metal containing layer on the node dielectric layer 8 that is present within the trench 10. The term "metal containing" denotes that at least one elemental metal is present in the material layer. The metal containing layer that provides the second electrode 9 may be composed of a metal selected from the group consisting of tungsten (W), titanium (Ti), tantalum (Ta), platinum (Pt), palladium (Pd), hafnium (Hf), zirconium (Zr), aluminum (Al) and combinations thereof. The metal containing layer that provides the second electrode 9 may also be composed of a metal nitride selected from the group consisting of titanium nitride (TiN), tantalum nitride (TaN), tantalum silicon nitride (TaSiN), or a combination thereof. The metal containing layer that provides the second electrode 9 may be composed of a metal or metal nitride that may be deposited within the trench 10 using physical vapor deposition (PVD), such as sputtering, atomic layer deposition (ALD) and/or chemical vapor deposition (CVD). The metal containing layer of the second electrode 9 may be a conformally deposited layer. In one embodiment, the second electrode 9 may have a thickness ranging from 1 nm to 20 nm. In another embodiment, the second electrode 9 has a thickness ranging from 3 nm to 7 nm. The metal containing layer that provides the second electrode 9 may be blanket deposited directly on the node dielectric layer 8, and before being recessed in subsequent processing, may be present over the entirety of the base and sidewall surfaces of the trench 10.

In some embodiments, following the formation of the second electrode 9, a semiconductor containing material 11 is deposited to fill the trench 10, wherein the semiconductor containing material 11 is deposited on the metal containing layer 20. The semiconductor containing material 11 is typically composed of a silicon containing material, such as silicon, single crystal silicon, amorphous silicon, polycrystalline silicon, polycrystalline silicon germanium, and combinations thereof. The semiconductor containing material 11 may be doped or undoped. The terms "doping" and "doped" denote adding dopant atoms to an intrinsic semiconductor, which changes the electron and hole carrier concentrations of the intrinsic semiconductor at thermal equilibrium. The dopant included in the doped semiconductor containing material 11 may include n-type dopants, p-type dopants or a combination thereof. As used herein, "p-type" refers to the addition of impurities to an intrinsic semiconductor that creates deficiencies of valence electrons. In a silicon containing material, examples of p-type dopants, i.e., impurities, include but are not limited to boron, aluminum, gallium and indium. As used herein, "n-type" refers to the addition of impurities that contributes free electrons to an intrinsic semiconductor. In a silicon containing material, examples of n-type dopants, i.e., impurities, include but are not limited to, antimony, arsenic and phosphorous. The dopant may be present in the doped semiconductor containing material 11 in a concentration that is greater than $1 \times 10^{17}$ atoms/cm$^3$. In another embodiment, the concentration of dopant in the doped semiconductor containing material 11 ranges from $1 \times 10^{17}$ atoms/cm$^3$ to $1 \times 10^{21}$ atoms/cm$^3$. In yet another embodiment, the concentration of dopant in the doped semiconductor fill material 25 ranges from $5 \times 10^{18}$ atoms/cm$^3$ to $1 \times 10^{20}$ atoms/cm$^3$. By "undoped" it is meant that the semiconductor containing material 30 is an intrinsic semiconductor material, which does not include n-type or p-type dopants. The semiconductor fill material 30 may include an impurity amount of n-type or p-type dopants that is no greater than $1 \times 10^{17}$ atoms/cm$^3$, but it is the intent that the undoped semiconductor containing material 11 have insulating properties.

The semiconductor fill material 11 may be deposited using chemical vapor deposition (CVD). Variations of CVD processes suitable for providing the semiconductor fill material 11 include, but are not limited to, Atmospheric Pressure CVD (APCVD), Low Pressure CVD (LPCVD), Plasma Enhanced CVD (EPCVD), Metal-Organic CVD (MOCVD), atomic layer deposition (ALD), and combinations thereof. In some embodiments, deposition of the semiconductor fill material 11 to fill the trench 10 is followed by a planarization step to remove any of the semiconductor fill material 11 that extends over the pad dielectric layer 6.

Figure 2:
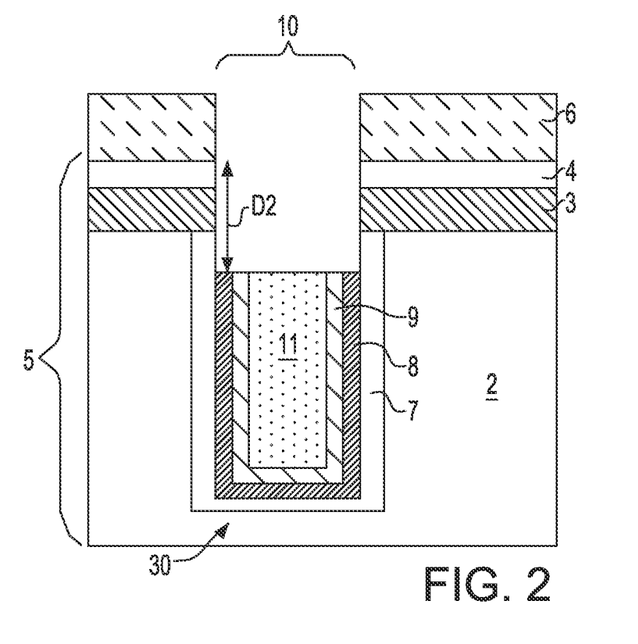
FIG. 2 is a side cross-sectional view of recessing the trench capacitor, in accordance with one embodiment of the present disclosure.

FIG. 2 depicts recessing the semiconductor fill material 11, the second electrode 9 and the node dielectric layer 8 of the trench capacitor 30 within the trench 10. In some embodiments, in which the first electrode 7 is provided by a metal layer that is deposited on the sidewalls and the base of the trench 10, the first electrode 7 may also be recessed within the trench 10. In some embodiments, the semiconductor fill material 11 and the second electrode 9 may be recessed, but the node dielectric layer 8 remains on the sidewalls of the trench 10. In some embodiments, the trench capacitor 30 is recessed to a depth D2 that is below the buried dielectric layer 3 of the ETSOI substrate 5. As measured from the upper surface of the SOI layer 4, the depth D2 of the recessed upper surface of the capacitor 30 may be present at a dimension ranging from 10 nm to 200 nm. In another embodiment, the depth D2 of the recessed upper surface of the capacitor 30 may range from 30 nm to 100 nm, as measured from the upper surface of the SOI layer 4.

In one embodiment, the etch process for recessing the capacitor 30 may be an anisotropic etch. The anisotropic etch for recessing the capacitor 30 may include reactive-ion etching (RIE), ion beam etching, plasma etching, and/or laser ablation. In another embodiment, the etch process for recessing the capacitor 30 may be isotropic etching. In comparison to anisotropic etching, isotropic etching is a non-directional etch. Examples of isotropic etching may include wet chemical etching. In another embodiment, the etch process for recessing the capacitor 30 may be the combination of anisotropic etching and isotropic etching.

The etch process for recessing the capacitor 30 may be a selective etch. For example, the etch process for recessing the capacitor 30 may include an etch chemistry that removes the material for the semiconductor containing material 11, the second electrode 9 and the node dielectric layer 8 selectively to the pad dielectric layer 6. In another embodiment, the etch process for recessing the capacitor 30 is a multi-stage etch that includes multiple etch chemistries. For example, a first etch chemistry may remove the semiconductor containing material 11 selectively to the pad dielectric layer 6 and the second electrode 9, and a second etch chemistry may remove the second electrode 9 selectively to the pad dielectric layer 6 and the recessed portion of the semiconductor containing material 11, wherein a third etch chemistry may be employed to recess the node dielectric layer 8 selectively to the pad dielectric layer 6 and the second electrode 9. In some examples, recessing the capacitor 30 may not include recessing the node dielectric 8, or the first electrode 7. In some examples, in which the first electrode 7 is a metal that is deposited on the sidewalls and the base of the trench 10, the first electrode 7 may also be recessed below the lower surface of the buried dielectric layer 3 of the ETSOI substrate 5. In the embodiments, in which the semiconductor containing material 11 is not doped, the semiconductor containing material 11 may be doped to a greater depth within the trench 10 than the second electrode 9 so that a sidewall portion of the first electrode 9 may be exposed for being contacted by the later formed connecting conductive material that is deposited atop the recessed semiconductor containing material 11.

One example of an etch that is suitable for recessing the second electrode 9 includes $NH_4OH$ and $H_2O_2$, and may be referred to as "SC-1" (standard clean #1). SC-1 includes a mixture of $NH_4OH$ and $H_2O_2$ and DI water. In one example, a typical concentration ratio for the mix is 1:1:5 $NH_4OH$:

$H_2O_2$:$H_2O$. Alternatively, the second electrode 9 can be removed by dry etch, such as chemical downstream etch (CDE). The portion of the trench 10 in which the recessed capacitor 30 is present may be referred to as the lower portion of the trench 10. The portion of the trench that is over the recessed capacitor 30 may be referred to as the upper portion of the trench 10.

Figure 3:
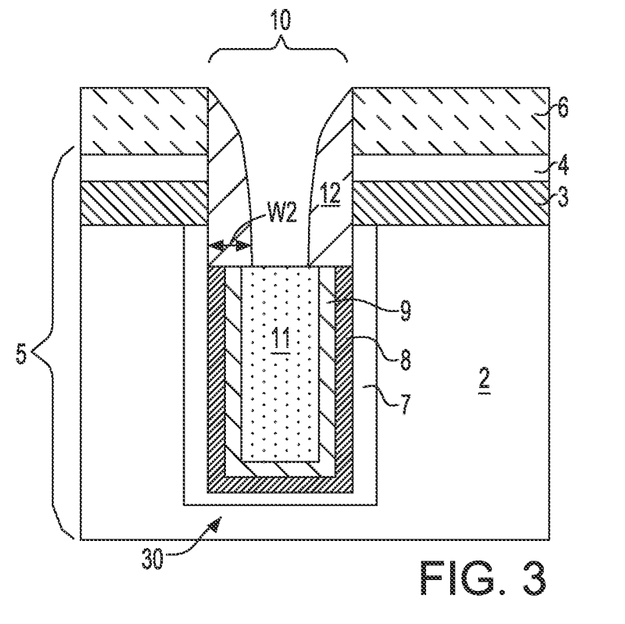
FIG. 3 is a side cross-sectional view of forming a dielectric spacer on the sidewalls of the trench, in accordance with one embodiment of the present disclosure.

FIG. 3 depicts one embodiment of forming a dielectric spacer 12 on the sidewalls of the trench 10 that have been exposed by recessing the capacitor 30. The dielectric spacer 12 may extend from the upper surface of the pad dielectric layer 6 to the recessed surface of the capacitor 30 along each sidewall of the trench 10. The dielectric spacer 12 covers the sidewall portions of the trench 10 that extend through the SOI layer 4 and the buried dielectric layer 3 portion of the ETSOI substrate 5. Typically, the dielectric spacer 12 is in direct contact with the sidewall portion of the base semiconductor layer 2 that has been exposed by the process steps to recess the capacitor 30. In some embodiments, the dielectric spacer 12 seals the second electrode 9 between the semiconductor containing material 11, the node dielectric layer 8 and the dielectric spacer 12.

The dielectric spacer 12 may be composed of any dielectric material, including oxides, nitrides, and oxynitride materials. One example of an oxide that is suitable for the dielectric spacer 12 is silicon oxide. One example of a nitride that is suitable for the dielectric spacer 12 is silicon nitride. In another embodiment, the dielectric spacer 12 may be composed of multiple dielectric materials. For example, the dielectric spacer 12 may be provided by a nitride liner, e.g., silicon nitride liner, that is in direct contact with the trench sidewall, and a oxide portion, e.g., silicon oxide portion, that is in direct contact with the nitride liner, wherein the oxide portion provides the exterior face of the dielectric spacer 12 that is in closest proximity of the center of the trench width. The overall width W2 of the spacer 12 may range from 3 nm to 20 nm. In another embodiment, the overall width W2 of the spacer 12 may range from 5 nm to 10 nm. In the embodiments, in which the spacer 12 is composed of the combination of a nitride liner and an oxide portion, the nitride liner may have a thickness ranging from 2 nm to 5 nm, e.g., 3 nm, and the oxide portion may have a thickness ranging from 5 nm to 10 nm, e.g., 5 nm.

The dielectric spacer 12 may be formed using deposition and etch processes. For example, a dielectric material for the dielectric spacer 12 may be deposited using a chemical vapor deposition (CVD) process, e.g., a conformal chemical vapor deposition (CVD) process, wherein the portion of the deposited dielectric material is removed from the central portion of the trench 10 with a reactive ion etch (RIE) process to expose an upper surface of the semiconductor containing material 11. The etch process employed to form the dielectric spacer 12 typically removes the dielectric material that provides the dielectric spacer 12 selectively to the pad dielectric layer 6 and the semiconductor containing material 11. Variations of CVD processes that are suitable for forming the dielectric spacer 12 include, but are not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. The dielectric spacer 12 may also be deposited using evaporation, chemical solution deposition, spin on deposition, and physical vapor deposition (PVD) methods. In addition to reactive ion etch, other anisotropic etch processes that may be employed in forming the dielectric spacer 12 include, for example, ion beam etching, plasma etching, laser ablation or a combination thereof.

Figure 4:
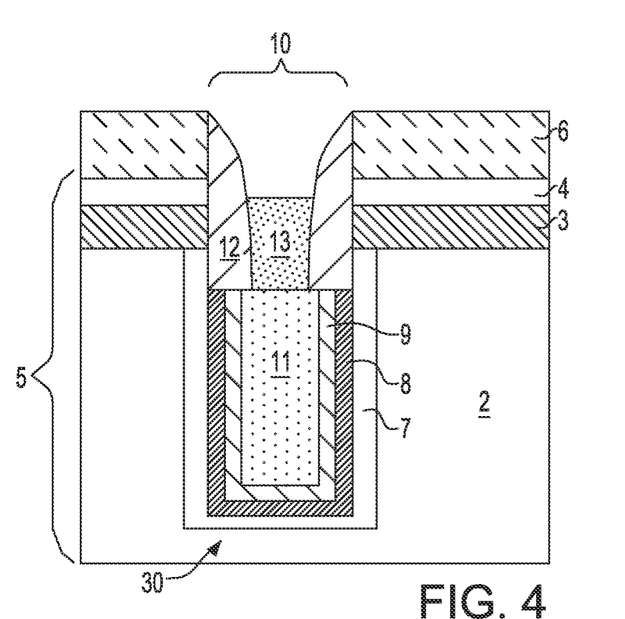
FIG. 4 is a side cross-sectional view of filling the trench with a connecting conductive material that is present on the recessed capacitor, in accordance with one embodiment of the present disclosure.

FIG. 4 depicts one embodiment of forming a connecting conductive material 13 (also referred to as "conductive material fill") in the trench 10, wherein the connecting conductive material 13 is in direct contact with the semiconductor containing material 11 that is present in the trench 10. In the embodiments, in which the semiconductor containing material 11 is doped with a p-type or n-type dopant, the connecting conductive material 13 is in electrical connection with the second electrode 9 of the capacitor 30 through the connecting conductive material 13. In the embodiments, in which the semiconductor containing material 11 is undoped at least a portion of the connecting conductive material 13 is in contact with a sidewall portion of the second electrode 9. The term "conductive" as used to describe the connecting conductive material 13 is meant to denote that the material being described has a room temperature conductivity of greater than $10^{-8}$ $(\Omega\text{-m})^{-1}$. In some embodiments, the connecting conductive material 13 provides for electrical communication between the capacitor 30 that is present in the trench 10 and semiconductor devices that are later formed on the upper surface of the ETSOI substrate 5. By electrical communication it is meant that electrical current is transmitted from the semiconductor devices to the capacitor 30.

In one embodiment, the connecting conductive material 13 is composed of a doped silicon containing material, such as silicon, single crystal silicon, polycrystalline silicon and combinations thereof. The dopant included in the doped semiconductor fill material may include n-type dopants, p-type dopants or a combination thereof. Examples of p-type dopants, i.e., impurities, that are suitable for a silicon containing connecting conductive material 13 include but are not limited to boron, aluminum, gallium and indium. Examples of n-type dopants, i.e., impurities, that are suitable for a silicon containing connecting conductive material 13 include, but are not limited to, antimony, arsenic and phosphorous. The dopant may be present in the connecting conductive material 13 in a concentration that is greater than $1\times10^{17}$ atoms/cm$^3$. In another embodiment, the concentration of dopant in the connecting conductive material 13 ranges from $1\times10^{17}$ atoms/cm$^3$ to $1\times10^{21}$ atoms/cm$^3$. In yet another embodiment, the concentration of dopant in the connecting conductive material 13 ranges from $5\times10^{18}$ atoms/cm$^3$ to $1\times10^{20}$ atoms/cm$^3$. In one example, the connecting conductive material 13 is composed of n-type polysilicon.

In some embodiments, and as shown in FIG. 4, the connecting conductive material 13 is recessed within the trench 20 by an anisotropic etch, such as reactive ion etch (RIE). The etch process for recessing the connecting conductive material 13 may be selective to the pad dielectric layer 6. In some embodiments, the upper surface of the connecting conductive material 13 is recessed to be below the upper surface of the SOI layer 4 and above the upper surface of the buried dielectric layer 3.

In some embodiments, following recessing of the connective conductive material 13 within the trench 10, the pad dielectric layer 6 may be removed. In some embodiments, the pad dielectric layer 6 may be chemically stripped or etched. In other embodiments, the pad dielectric layer 6 may be removed by planarization, e.g., chemical mechanical planarization (CMP), stopping on the upper surface of the SOI layer 4 of the ETSOI substrate 5. In some embodiments, removing the pad dielectric layer 6 may recess the upper surface of the dielectric spacer 12, so that the upper surface of the dielectric spacer 12 is substantially coplanar with the upper surface of the SOI layer 4 of the ETSOI substrate 5.

Figure 5A:
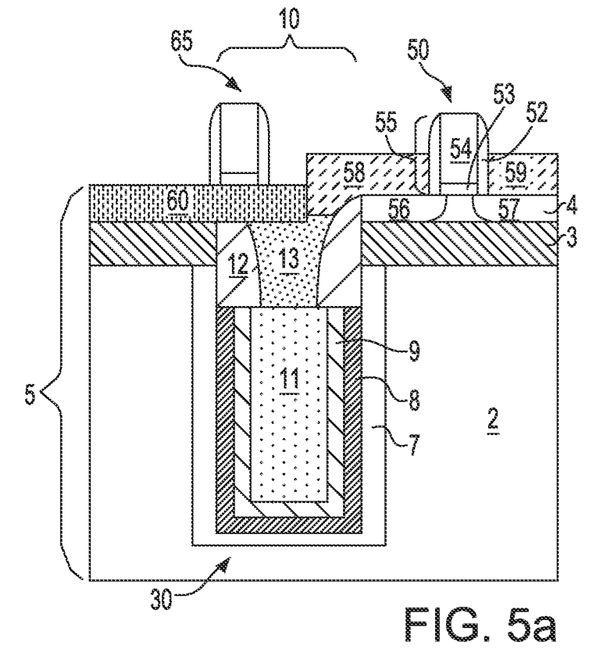
FIG. 5A is a side cross-sectional view depicting forming a semiconductor device in electrical communication with the trench capacitor through the connecting conductive material, wherein the trench capacitor includes a lower electrode provided by a doped portion of the base and sidewalls of the lower portion of the trench, in accordance with one embodiment of the present disclosure.

FIG. 5A depicts forming a semiconductor device 50 in electrical communication with the trench capacitor 30 through the connecting conductive material 13. The semiconductor device 50 that is depicted in FIG. 5A is a field effect transistor (FET) that includes a gate structure 55, an extension source region 56, an extension drain region 57, a raised source region 58, and a raised drain region 59. The semiconductor device 50 is present on one side of the trench 10, and an isolation region 60 is present on the other side of the trench 10. The isolation region 60 may be formed by etching a trench into the SOI layer 4 of the ETSOI substrate 5 and a portion of the connecting conductive material 13 from the trench 10 utilizing a dry etching process, such as reactive-ion etching (RIE) or plasma etching. Chemical vapor deposition (CVD) or another like deposition process is used to fill the trench with a dielectric material, such as an oxide, nitride or oxynitride material. The isolation region 60 does not extend over the entire upper surface of the connecting conductive material 13. The isolation region 60 does not cover a portion of the connecting conductive material 13 on the side of the trench 10 that is closest to the semiconductor device 50.

The gate structure 55 of the semiconductor device 50 may include at least one gate dielectric layer 53 and at least one gate conductor layer 54. Sidewall dielectric spacers 52 may be formed on the sidewall of the gate structure 55. The source extension region 56 and the drain extension region 57 may be n-type or p-type doped regions in the SOI layer 4 of the ETSOI substrate 5. The source extension region 56 and the drain extension region 57 may be formed on opposing sides of the gate structure using ion implantation. The raised source region 58 and the raised drain region 59 typically are doped to the same conductivity type, i.e., p-type or n-type, as the source extension region 56 and the drain extension region 57.

The raised source region 58 and the raised drain region 59 may be formed using an epitaxial growth process. Epitaxial growth means the growth of a semiconductor material on a deposition surface of a semiconductor material, in which the crystal orientation of the semiconductor material being grown is determined by that of the semiconductor material of the deposition surface. The epitaxial growth process is selective to deposition on semiconductor materials. Therefore, the raised source region 58 and the raised drain region 59 is formed on the exposed upper surface of the source extension region 56 and the drain extension region 57, as well as the exposed portion of the connecting conductive material 13 that is present in the trench. In one embodiment, the raised source region 58 may extend from the connecting conductive material 13 to the source extension region 56 providing electrical communication between the capacitor 30 and the semiconductor device 50. In some embodiments, a pass gate 65 may be present over the isolation region 60.

Figure 5B:
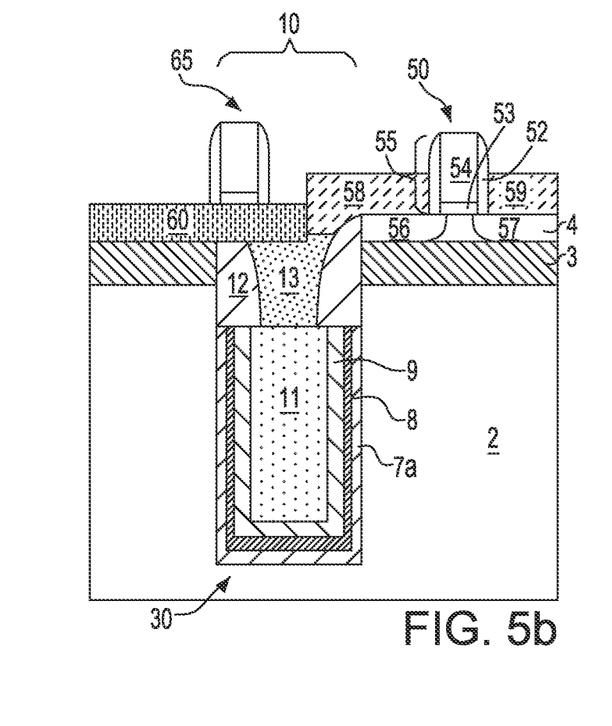
FIG. 5B is a side cross-sectional view depicting forming a semiconductor device in electrical communication with the trench capacitor through the connecting conductive material, wherein the trench capacitor includes a lower electrode provided by a metal layer deposited on the base and sidewalls of the lower portion of the trench, in accordance with one embodiment of the present disclosure.

In FIG. 5A the trench capacitor 30 includes a lower electrode 7 provided by a doped portion of the base and sidewalls of the trench 10. FIG. 5B depicts a memory device that is similar to the memory device depicted in FIG. 5A, in which the lower electrode 7a of the trench 10 is provided by a metal that is deposited on the sidewalls and base of the trench 10.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a memory device comprising:
   providing a semiconductor on insulator (SOI) substrate including a semiconductor on insulator (SOI) layer over a buried dielectric layer, wherein the buried dielectric layer has a thickness of less than 100 nm and is present on a base semiconductor layer;
   forming a trench through the SOI layer and the buried dielectric layer and into the base semiconductor layer;
   forming a capacitor in the trench;
   recessing the capacitor in the trench to a depth that is below the buried dielectric layer;
   forming a dielectric spacer on the sidewalls of the trench, wherein the dielectric spacer is present on portions of the trench where said sidewalls are provided by the SOI layer and the buried dielectric layer;
   filling the trench with a connecting conductive material that is present on the capacitor; and
   forming a semiconductor device on the SOI layer, wherein the semiconductor device is present in electrical communication with the capacitor through the connecting conductive material.

2. The method of claim 1, wherein the SOI layer has a thickness of 10 nm or less.

3. The method of claim 1, wherein the forming of the trench comprises:
   forming at least one pad dielectric layer on an upper surface of the SOI substrate;
   patterning the at least one pad dielectric layer to provide an opening over a portion of the SOI substrate in which the trench is to be formed; and
   etching the SOI substrate to provide the trench.

4. The method of claim 1, wherein the forming of the capacitor comprises:
   doping the sidewalls and a base of the trench with a p-type or n-type dopant to provide a first electrode;
   forming a node dielectric layer on the sidewalls and the base of the trench;
   forming a metal layer on the node dielectric layer that is present on the sidewalls and the base of the trench, wherein the metal layer provides an second electrode; and
   filling the trench with a semiconductor containing material.

5. The method of claim 1, wherein the forming the capacitor comprises:
   forming a first metal layer on the sidewalls and a base of the trench to provide a first electrode;
   forming a node dielectric layer on the first metal layer that is present on the sidewalls and the base of the trench;
   forming a second metal layer on the node dielectric layer that is present on the sidewalls and the base of the trench, wherein the second metal layer provides an second electrode; and
   filling the trench with a semiconductor containing material.

6. The method of claim 3, wherein the recessing of the capacitor in the trench to a depth that is below the buried dielectric layer comprises an anisotropic etch that is selective to the at least one pad dielectric layer.

7. The method of claim 1, wherein forming the dielectric spacer comprises:
   depositing a dielectric material on at least portions of the sidewalls that are exposed by the recessing of the capacitor, and
   etching the dielectric material to expose a surface of the capacitor that is recessed within the trench, wherein the etching does not remove the dielectric material on the sidewall portions of the trench protecting the SOI layer and the buried dielectric layer.

8. The method of claim 7, wherein the dielectric spacer comprises a nitride liner present on the sidewalls of the trench, and an oxide portion on the nitride layer.

9. The method of claim 1, wherein filling the trench with the connecting conductive material that is present on the capacitor comprises depositing doped polysilicon.

10. The method of claim 3 further comprising recessing the connecting conductive material that is present in the trench to at least a depth that is below an upper surface of the SOI layer, and removing the at least one pad dielectric layer.

11. The method of claim 10, wherein the forming of the semiconductor device on the SOI layer comprises:
   forming a gate structure on the SOI layer adjacent to the trench;
   forming an extension source region and an extension drain region in the SOI layer on opposing sides of the gate structure;
   forming a raised source region on the extension source region and a raised drain region on the extension drain region, wherein one of the raised source region and the raised drain region is in contact with the connecting conductive material that is present in the trench.

12. A memory device comprising:
   semiconductor on insulator (SOI) substrate including a semiconductor on insulator (SOI) layer over a buried dielectric layer, wherein the SOI layer has a thickness of 10 nm or less and the buried dielectric layer has a thickness of less than 100 nm and is present on a base semiconductor layer;
   a trench extending through the SOI layer and the buried dielectric layer and into the base semiconductor layer of the SOI substrate;
   a capacitor in a lower portion of the trench;
   a dielectric spacer on sidewalls of an upper portion of the trench, wherein the dielectric spacer is present on portions of the trench where said sidewalls are provided by the SOI layer and the buried dielectric layer;
   a conductive material fill in the upper portion of the trench; and
   a semiconductor device on the SOI layer that is adjacent to the trench, wherein the semiconductor device is in electrical communication with the capacitor through the conductive material fill.

13. The memory device of claim 12, wherein the capacitor includes a first metal electrode present on a base and sidewalls of the lower portion of the trench, a node dielectric layer present on the first metal electrode, and a second metal electrode present on the node dielectric layer.

14. The memory device of claim 12, wherein the capacitor includes a doped region present in the base and sidewalls of the lower portion of the trench, wherein the doped region provides a lower electrode of the capacitor, a node dielectric layer present on the doped region, and a metal layer on the node dielectric layer, wherein the metal layer provides an upper electrode of the capacitor.

15. The memory device of claim 12, wherein the dielectric spacer has a width ranging from 3 nm to 20 nm.

16. The memory device of claim 12, wherein the dielectric spacer comprises a nitride liner present on the sidewalls of the upper portion of the trench, and an oxide portion on the nitride layer.

17. The memory device of claim 16, wherein the nitride liner has a width of 5 nm or less, and the oxide portion of the dielectric spacer has a width of 10 nm or less.

18. The memory device of claim 12, wherein the conductive material fill is p-type or n-type doped polysilicon.

19. The memory device of claim 18, wherein the semiconductor device comprises:
   a gate structure;
   an extension source region and an extension drain region on opposing sides of the gate structure;
   a raised source region on the extension source region and a raised drain region on the extension drain region, wherein one of the raised source region and the raised drain region is in contact with the conductive material fill that is present in the trench.

* * * * *